United States Patent [19]

Fukasawa et al.

[11] Patent Number: 5,342,471
[45] Date of Patent: Aug. 30, 1994

[54] PLASMA PROCESSING APPARATUS INCLUDING CONDENSATION PREVENTING MEANS

[75] Inventors: Kazuo Fukasawa, Kofu; Masachika Suetsugu, Yamanashi, both of Japan

[73] Assignee: Tokyo Electron Yamanashi Limited, Nirasaki, Japan

[21] Appl. No.: 870,827

[22] Filed: Apr. 20, 1992

[30] Foreign Application Priority Data

Apr. 22, 1991 [JP] Japan .................. 3-090401

[51] Int. Cl.⁵ .............................................. B44C 1/22
[52] U.S. Cl. ..................... 156/345; 156/643; 118/723 E; 204/298.09
[58] Field of Search ............ 118/723 E, 723 ER, 724, 118/725, 728, 732; 156/345, 643; 204/298.09

[56] References Cited

U.S. PATENT DOCUMENTS

| | | | |
|---|---|---|---|
| 4,878,995 | 11/1989 | Arikado et al. | 156/643 |
| 5,078,851 | 1/1992 | Nishihata et al. | 118/724 X |
| 5,215,619 | 6/1993 | Cheng et al. | 118/724 X |

FOREIGN PATENT DOCUMENTS 3-107484 5/1991 Japan .

*Primary Examiner*—R. Bruce Breneman
*Assistant Examiner*—Jonathan D. Baskin
*Attorney, Agent, or Firm*—Oblon, Spivak, McClelland, Maier & Neudstadt

[57] ABSTRACT

A plasma processing apparatus having a pair of electrodes which are installed alternately in parallel in a chamber and in which an object to be processed is placed at one electrode thereof, radiofrequency applying device for applying radiofrequency power between the pair of electrodes, cooling device for cooling the object, drying-gas introducing tube for supplying a drying gas into the chamber, and dropwise-condensation preventing member installed at a portion of the chamber so as to be in contact with the outer atmosphere. The apparatus can prevent dropwise condensation at the time of cooling and at the same time prevent the occurrence of radiofrequency leakage.

25 Claims, 4 Drawing Sheets

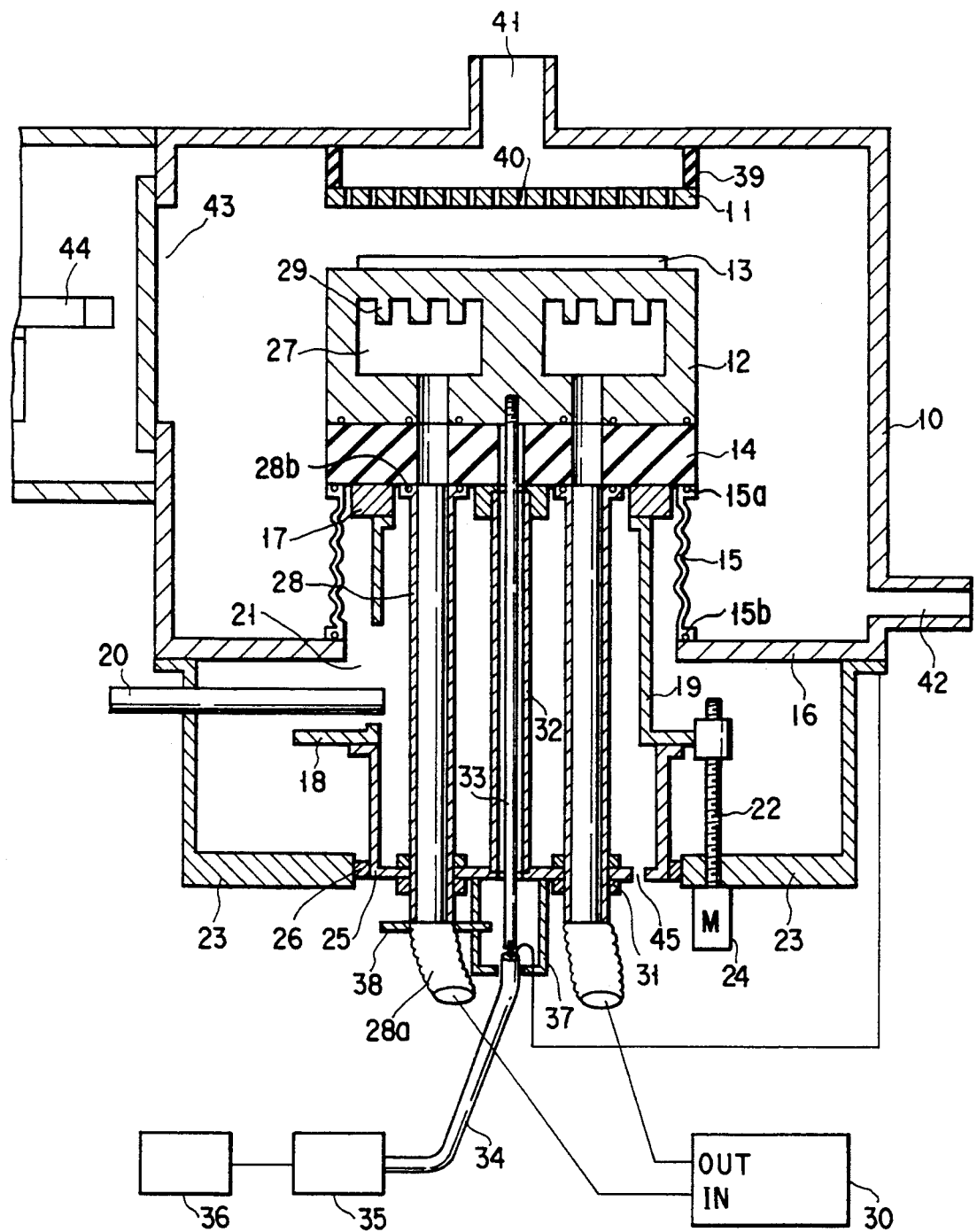
F I G. 1

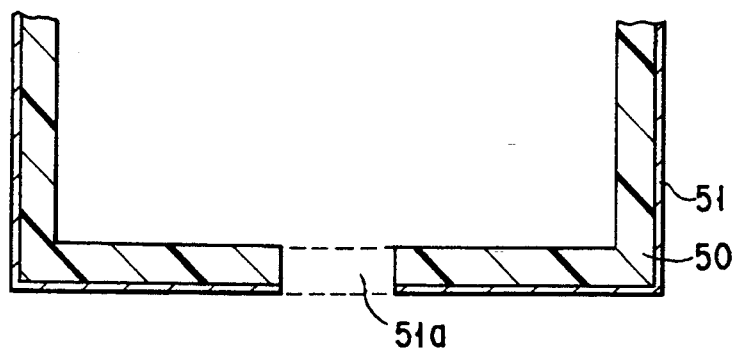
F I G. 2A
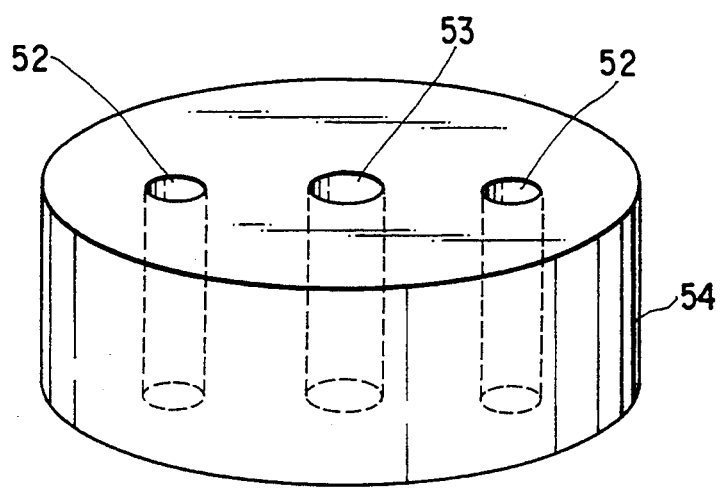
F I G. 2B
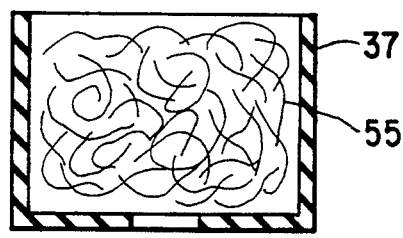
F I G. 2C

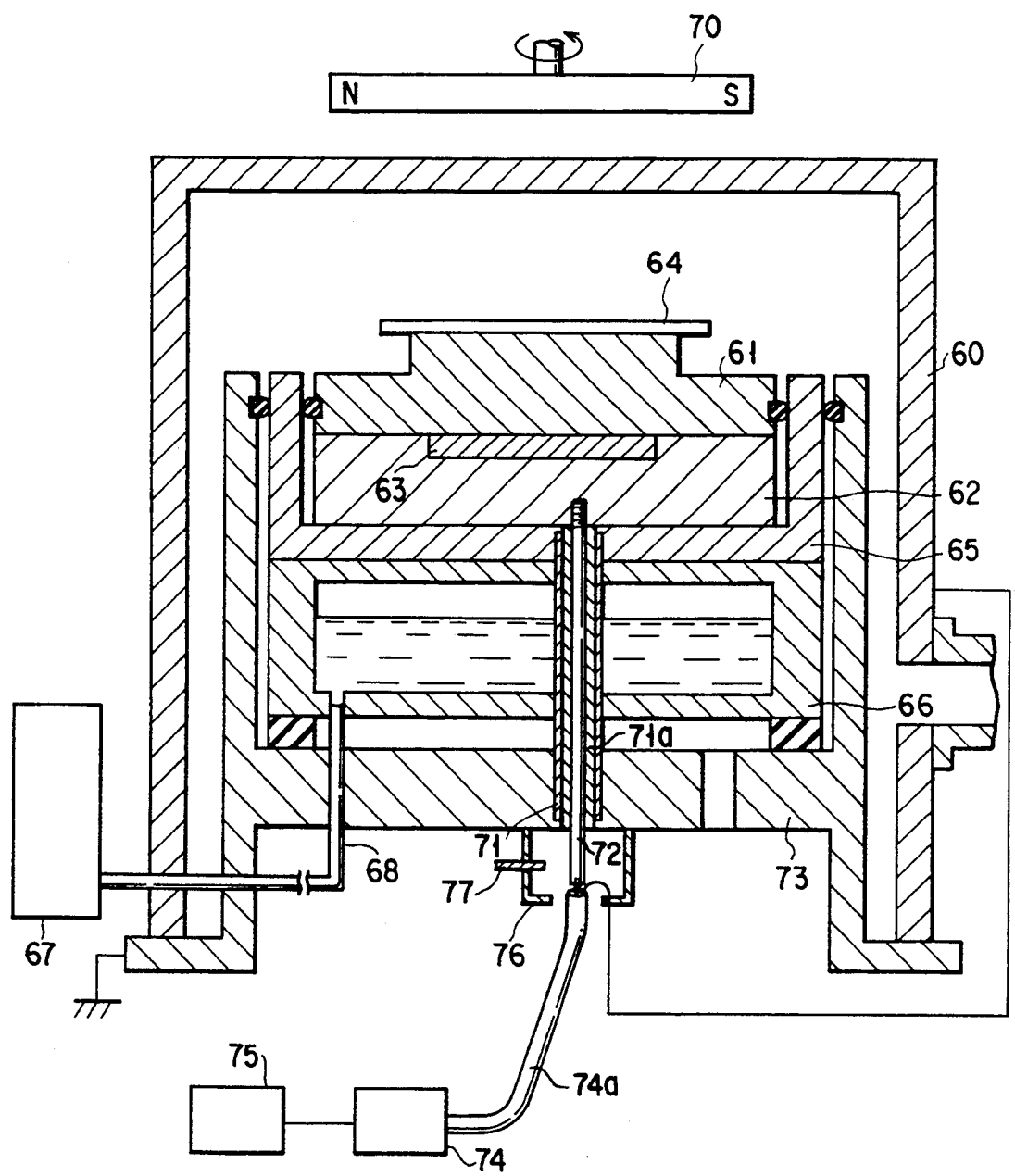
F I G. 3

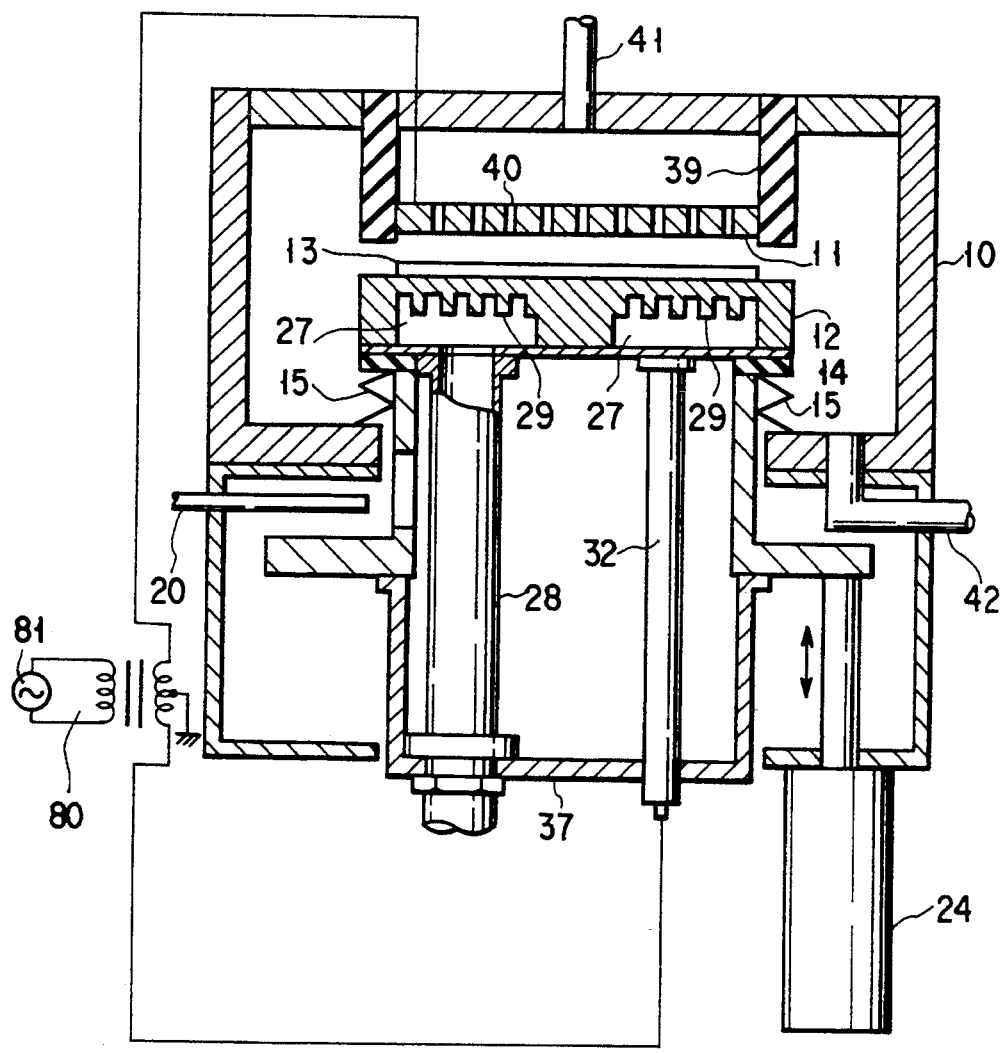
F I G. 4

PLASMA PROCESSING APPARATUS INCLUDING CONDENSATION PREVENTING MEANS

BACKGROUND OF THE INVENTION

1. Field of the Invention

The present invention relates to a plasma processing apparatus.

2. Description of the Related Art

A plasma processing apparatus for generating plasma by applying radiofrequency power to a space between electrodes and for processing substrates by utilizing this plasma is widely known and used. In the manufacturing process of a semiconductor device, for example, a dry-etching apparatus for etching, by means of plasma, or a plasma CVD apparatus and sputtering apparatus for forming a thin film by using plasma are commonly utilized.

In these conventional plasma processing apparatus, for example in a dry-etching device, parallel plain electrodes consisting of upper and lower electrodes are provided in a chamber, and a semiconductor wafer having a thin film formed on its surface is placed on the lower electrode. The thin film on the surface of the semiconductor wafer is dry-etched the thin film by introducing a process gas into this chamber and supplying a predetermined radiofrequency power to the space between the upper and lower electrodes to generate plasma. Generally, in order to cool a semiconductor wafer which is being processed, a cooling mechanism for circulating a refrigerant in the lower electrode is provided in the apparatus.

In a current dry-etching apparatus, however, a refrigerant at a low temperature of almost −30° C. is circulated to cool a semiconductor wafer, and there occurs the problem that condensation occurs at a portion cooled by a cooling mechanism, for example, a refrigerant circulating pipe or a metal cover for covering cooled portions. This tendency is particularly pronounced in the case of cooling a wafer by using liquid nitrogen. In order to resolve this problem, selection of a resin having a low thermal conductivity for use as the material of the cover has been attempted. However, if a resin is used as the material for forming the cover, there occurs a problem in that leakage of radiofrequency occurs.

Therefore, a plasma processing apparatus having a cooling mechanism which can prevent the occurrence of condensation and at the same time prevent radiofrequency leakage is yet to be sufficiently realized.

SUMMARY OF THE INVENTION

Accordingly, it is an object of the present invention to provide a plasma processing apparatus which can prevent condensation at the time of cooling and at the same time prevent the occurrence of radiofrequency leakage.

This object can be achieved by a plasma processing apparatus having a pair of electrodes which are installed alternately in parallel in a chamber and in which an object to be processed is placed at one electrode thereof, radiofrequency applying means for applying radiofrequency power between the pair of electrodes, cooling means for cooling the object, drying-gas introducing means for supplying a drying gas into the chamber, and condensation preventing means installed at a portion of the chamber so as to be in contact with the outer atmosphere.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic view showing the structure of a dry-etching apparatus according to one embodiment of the present invention;

FIG. 2A to 2C are views illustrating condensation preventing means; and

FIG. 3 and FIG. 4 are schematic views showing the structure of a dry-etching apparatus according to another embodiment of the present invention.

DETAILED DESCRIPTION OF THE PREFERRED EMBODIMENTS

An embodiment of the plasma processing apparatus of this invention will be described in detail. Here, a dry-etching apparatus is used as the plasma processing apparatus.

FIG. 1 is a schematic view showing a dry-etching apparatus. In FIG. 1, numeral 10 denotes a cylindrical chamber. Main members in chamber 10 are made of, for example, aluminium whose surfaces are anodized. In chamber 10, upper electrode 11 and lower electrode 12 having disc shape are disposed substantially parallel to and facing each other. The upper electrode 11 and lower electrode 12 are made of carbon, anodizing aluminum.

Semiconductor wafer 13 to be processed is mounted on lower electrode 12. Insulating member 14 made of ceramic, etc. is attached through sealing members made of elastic material, e.g. O-ring 15a to a lower portion of lower electrode 12. Bellows 15 made of SUS316, etc. is attached through sealing members to a lower portion of insulating member 14 and is also attached through sealing members 15b to extending portion 16 of chamber 10, so as to seal the chamber.

Cylindrical connecting member 19 having a thickness of almost 5 mm and flange 18 formed at its lower end, is attached to a lower portion of heat-insulating member 14 through member 17 having a thickness of approximately 50 mm. Member 17 and connecting member 19 are made of aluminium or the like. Long aperture 21 into which first drying-gas introducing tube 20 can be inserted is formed at the side wall of connecting member 19. The size of long aperture 21 is determined so that first drying-gas introducing tube 20 can be inserted into the aperture if the relative positions of connecting member 19 and drying gas introducing tube 20 change due to the movement of bellows 15. A drive means consisting of bowl screw 22 and the other members is connected to flange 18. Bowl screw 22 is connected to drive source 24, for example a motor, through lower flange 23 of chamber 10. An air cylinder can be utilized as the drive means. Lower electrode 12, together with heat-insulating member 14 and connecting member 19, can be moved up and down by this drive means.

Protecting cover as a condensation preventing member 25 is attached to a lower portion of flange 18. Protecting cover 25 and lower flange 23 are sealed by sealing member 26, if protecting cover 25 is moved up and down by drive source 24.

Two annular refrigerant paths 27 are formed in lower electrode 12. Refrigerant paths 27 communicate with refrigerant tubes 28 made of insulator e.g. alumina arranged inside chamber 10 via refrigerant paths formed in heat-insulating member 14. Electrical insulation and safety can be improved by means of refrigerant tubes 28. Fin-shaped projections 29 are provided at the top of refrigerant paths 27 of lower electrode 12 so as to improve the heat exchange. Refrigerant tubes 28 are attached via sealing members 28b to insulating member 14 and connected with cooling device, e.g. chiller 30 via general flexible tubes 28a made of resin or the like, through the bottom of protecting cover 25. Engaging member 31 made of Teflon or ceramic is attached to the bottom of cover 25 through which refrigerant tubes 28 penetrate. Electrode-rod guiding tube 32 is held between member 17 and the bottom of cover 25. Electrode-rod guiding tube 32 is a tube having an outer diameter of almost 20 mm$\phi$. This tube is formed by inserting a Teflon pipe having an inner diameter of almost 6 mm$\phi$ into a copper pipe. Electrode rod 33 having an outer diameter of almost 6 mm$\phi$ is inserted into electrode-rod guiding tube 32. One end of electrode rod 33 is attached by means of a screw to lower electrode 12 through the electrode rod path of heat-insulating member 14. The other end of electrode rod 33 is connected to coaxial cable 34, and coaxial cable 34 is connected to matching circuit 35 through cover 25. Matching circuit 35 is connected to radiofrequency source 36. Protecting cover 37 is attached, as a condensation preventing means, to the region under protecting cover 25, which is between the penetrating portions of both refrigerant tubes 28. As shown in FIG. 2A, protecting cover 25, 37 is produced by forming cylindrical member 50 of 3 to 5 mm thickness, which is made of ABS (acrylonitrile-butadiene-styrene) resin, polyvinyl chloride, phenol resin or the like and has one end closed, by forming conductive layer 51 of, for example, electroless nickel plating and having a thickness of 5 to 10 $\mu$m, on the cylindrical member 50 and by forming a desired number of openings 51a. Materials and the forming method of conductive layer 51 are not particularly limited. For example, copper, silver or aluminum is used as a metal of the conductive layer 51. Adhesion of a thin film made of metal or plasma flame spray is used as the forming method of conductive layer 51. Second drying-gas introducing tube 38 for supplying N$_2$ gas, etc. is penetrated through the side wall of protecting cover 37.

On the other hand, upper electrode 11 is supported by cylindrical insulating member 39 made of alumina ceramics or the like in an electrically insulated state from chamber 10. A plurality of process-gas supply openings 40 are formed at upper electrode 11 to enable a process gas (etching gas) supplied from process-gas supplying tube 41 to flow into chamber 10. Gas discharging tube 42, which is attached to the side wall of chamber 10, communicates with a vacuum means not shown in the figure. Also, semiconductor wafer entrance 43 is formed at the side wall of chamber 10 so that loadrock conveying arm 44 can convey semiconductor wafer 13.

The process using a dry-etching apparatus having this structure will be explained below. First, connecting member 19 is lowered by drive means. At this time, lower electrode 12 and heat-insulating member 14 is lowered and bellows 15 is in the compressed condition. Then, semiconductor wafer 13, on which a thin film is formed, is installed on lower electrode 12 by loadlock conveying arm 44. Lower electrode 12 is raised and moves to a predetermined position in chamber 10. Pressure in chamber 10 is reduced to a determined value by means of gas discharging tube 42, and a predetermined process gas is introduced from process-gas supplying tube 41. The introduced process gas is introduced from process-gas supply openings 40 into chamber 10 and is emitted to semiconductor wafer 13. At the same time, a predetermined frequency, for example a radiofrequency power of 13.56 MHz, is applied from radiofrequency source 36 to the space between upper electrode 11 and lower electrode 12. Because of this process, discharging occurs in the space between upper electrode 11 and lower electrode 12, the process gas becomes plasma, and the thin film formed on the surface of semiconductor wafer 13 is dry-etched by the process gas.

At the same time, a refrigerant such as ethylene glycol is circulated in refrigerant paths 27, refrigerant pipes 28 and chiller 30, and semiconductor wafer 13 is cooled at almost $-30°$ C.

At this time, the lower portion of lower electrode 12, refrigerant tubes 28, etc. are efficiently cooled to a very low temperature. Further, protecting cover 25, 37, directly in contact with the outer atmosphere, is also cooled to a very low temperature. However, since protecting cover 25, 37 has the structure as shown in FIG. 2A, i.e. since the cover is made of resin having a low thermal conductivity, the temperature at protecting cover 25, 37 is not reduced excessively. Therefore, the occurrence of condensation at protection cover 25, 37 can be prevented. Also, since conductive layer 51 is formed on the surface of protecting cover 25, 37, radiofrequency leakage can be prevented by connecting conductive layer 51 to a grounding potential. Further, in the case of this embodiment, first drying-gas introducing tube 20 is provided in chamber 10, which introduces a dry gas, for example, dry air, nitrogen gas, etc. in the space surrounded by lower electrode 12, connecting member 19 and cover 25, and discharges them from opening 45 at the bottom of cover 25. Therefore, the occurrence of condensation can also be prevented in this space.

In this apparatus, since a predetermined space is formed between members to be cooled and various other members, the other members are cooled only slightly and the occurrence of condensation on them can also be prevented.

In this embodiment, a molded body covered with a conductive layer is used as protective cover 37. Metals such as aluminum, stainless steel are used as the materials for forming the protective cover and, as shown in FIG. 2B, heat-insulating member 54 having refrigerant tube apertures 52 and electrode-rod guiding tube aperture 53 can be installed at the bottom of cover 25. Also, as shown in FIG. 2C, lagging cover 55, which has refrigerant tube apertures and electrode-rod guiding aperture and at which glass wool or cotton is loaded, can be installed at the bottom of cover 25. In these cases, condensation caused by heat-insulating member 54 or lagging cover 55 can be prevented, and leakage can be prevented by the metal protective cover.

FIG. 3 is a schematic view showing the structure of a magnetton-plasma etching apparatus according to another embodiment of the present invention. In this figure, numeral 60 denotes a chamber. In chamber 60, electrical heating element, e.g. heater 63 is provided between upper suscepter 61 made of, e.g. aluminum and lower suscepter 62 made of, e.g. aluminum, and is able to finely control the temperature (e.g. a range of from $-10°$ C. to $-150°$ C.) of semiconductor wafer 64 on upper suscepter 61.

Upper and lower suscepters 61 and 62 are insulated by insulating frame 65 made of, e.g. ceramic. The lower surface of lower suscepter 62 is joined to the bottom surface of insulating frame 65. Insulating frame 65 is installed on the upper surface of cooling jacket 66 made of, e.g. aluminum in which liquid nitrogen is contained. Cooling jacket 66 communicates via pipe 68 with liquid nitrogen supplying source 67. Permanent magnet 70, which is rotatable and can be applied the magnetic field parallel to a surface of semiconductor wafer 64, is installed over chamber 60.

Electrode-rod guiding 71a tube 71 penetrates the central portion of cooling jacket 66. Insulating pipe 71a made of Teflon is inserted into electrode-rod guiding tube 71. Electrode rod 72 is inserted into insulating pipe 71a. Electrode rod 72 is made to connect to lower suscepter 62 by means of a screw. Electrode rod 72 is connected to matching circuit 74 through lower frame 73 of the chamber via coaxial cable 74a and matching circuit 74 is connected to radiofrequency source 75. Protecting cover 76 is attached as condensation preventing means at the penetrating portion of electrode-rod guiding tube 71 in lower frame 73. Drying-gas introducing tube 77 for supplying $N_2$ gas, etc., is penetrated through the side wall of protecting cover 37. Protecting cover 76 is made as shown in FIG. 2A. Heat-insulating member 54 and lagging box 55 shown in FIGS. 2B and 2C can be used in place of the protecting cover, as condensation preventing means.

In the magnetton-plasma etching apparatus having this structure, since liquid nitrogen is used as refrigerant, the members in chamber 60 are at an extremely low temperature and condensation easily occurs at lower frame 73 in contact with the outer atmosphere. However, the occurrence of condensation can be sufficiently prevented by protecting cover 76.

In the dry-etching apparatus in FIG. 1, electrode rod 33 is connected to lower electrode 12 only. However, as shown in FIG. 4, the structure can be employed such that transformer 80 is used as an electricity supplying mechanism, power is supplied to both upper and lower electrodes 11 and 12, and plasma is generated between both electrodes. Radiofrequency source 81 is used as AC power source of the transformer 80.

A dry-etching apparatus is explained in this embodiment, however, the present invention is not limited by the embodiment. If there is a plasma processing apparatus which operates both cooling and radiofrequency application, the present invention can be applied for other cases.

As explained above, in accordance with the plasma processing apparatus of the present invention, the occurrence of condensation at the time of cooling can be prevented and the occurrence of radio-frequency leakage can be also prevented.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A plasma processing apparatus, comprising:
   a pair of electrodes installed in parallel with each other in a chamber, with an object to be processed being placed on one electrode thereof;
   radiofrequency applying means for applying radiofrequency power to a space between the pair of electrodes and having a connecting portion;
   cooling means for cooling the object to be processed;
   gas introducing means for supplying a drying gas to the chamber; and
   condensation preventing means installed at a portion of the camber to be in contact with outer atmosphere,
   wherein said connection portion is located in the condensation preventing means and outside of the chamber.

2. A plasma processing apparatus according to claim 1, wherein said drying gas includes one of dry air and a nitrogen gas.

3. A plasma processing apparatus according to claim 1, wherein said condensation preventing means is a cover produced by forming a metal layer on an outer surface of a molded member made of a resin material.

4. A plasma processing apparatus according to claim 3, wherein said resin material is a resin material selected from the group consisting of acrylonitrile-butadiene-styrene resin, polyvinyl chloride and phenol resin.

5. A plasma processing apparatus according to claim 3, wherein said metal layer is made of a metal selected from the group consisting of nickel, copper, silver, and aluminum.

6. A plasma processing apparatus according to claim 3, wherein the metal layer is formed on the molded member by a process selected from the group consisting of plating, adhesion of a thin film made of metal, and plasma flame spray.

7. A plasma processing apparatus according to claim 1, wherein said cooling means circulates a refrigerant by means of two refrigerant tubes, refrigerant paths formed in the electrode, and a chiller, and wherein at least one portion of the refrigerant tubes is made of ceramic.

8. A plasma processing apparatus according to claim 7, wherein said ceramic is a ceramic selected from the group consisting of $Al_2O_3$, $Si_3N_4$, and $ZnO_2$.

9. A plasma processing apparatus according to claim 1, wherein said cooling means is a cooling jacket containing liquid nitrogen.

10. A plasma processing apparatus according to claim 1, wherein said condensation preventing means is a heat-insulating member.

11. A plasma processing apparatus according to claim 10, wherein said heat-insulating member is made of plastic foam.

12. A plasma processing apparatus according to claim 1, wherein said condensation preventing means is a lagging box.

13. A plasma processing apparatus, comprising:

a pair of electrodes installed in parallel with each other in a chamber, with an object to be processed being placed on one electrode thereof;

radiofrequency applying means for applying radiofrequency power to a space between the pair of electrodes;

cooling means for cooling the object to be processed;

a first gas introducing means for supplying a first drying gas to the chamber;

condensation preventing means installed at a portion of the camber to be in contact with outer atmosphere; and a second gas introducing means for supplying a second drying gas to said condensation preventing means.

14. A plasma processing apparatus according to claim 13, wherein said first drying gas includes one of dry air and a nitrogen gas.

15. A plasma processing apparatus according to claim 13, wherein said second drying gas is a nitrogen gas.

16. A plasma processing apparatus according to claim 13, wherein said condensation preventing means is a cover produced by forming a metal layer on an outer surface of a molded member of a resin material.

17. A plasma processing apparatus according to claim 16, wherein said resin material is a resin material selected from the group consisting of acrylonitrile-butadiene-styrene resin, polyvinyl chloride, and phenol resin.

18. A plasma processing apparatus according to claim 16, wherein said metal layer is made of a metal selected from the group consisting of nickel, copper, silver, and aluminum.

19. A plasma processing apparatus according to claim 16, wherein the metal layer is formed on the molded member by a process selected from the group consisting of plating, adhesion of a thin film made of metal, and plasma flame spray.

20. A plasma processing apparatus according to claim 13, wherein said cooling means circulates a refrigerant by means of two refrigerant tubes, refrigerant paths formed in the electrode, and a chiller, and wherein at least one portion of the refrigerant tubes is made of ceramic.

21. A plasma processing apparatus according to claim 20, wherein said ceramic is a ceramic selected from the group consisting of $Al_2O_3$, $Si_3N_4$, and $ZnO_2$.

22. A plasma processing apparatus according to claim 13, wherein said cooling means is a cooling jacket containing liquid nitrogen.

23. A plasma processing apparatus according to claim 13, wherein said condensation preventing means is a heat-insulating member.

24. A plasma processing apparatus according to claim 23, wherein said heat-insulating member is made of plastic foam.

25. A plasma processing apparatus according to claim 13, wherein said condensation preventing means is a lagging box.

* * * * *